Feb. 3, 1970 K. H. KUPFER 3,493,870
MIXING CIRCUIT ARRANGEMENT
Filed May 17, 1966
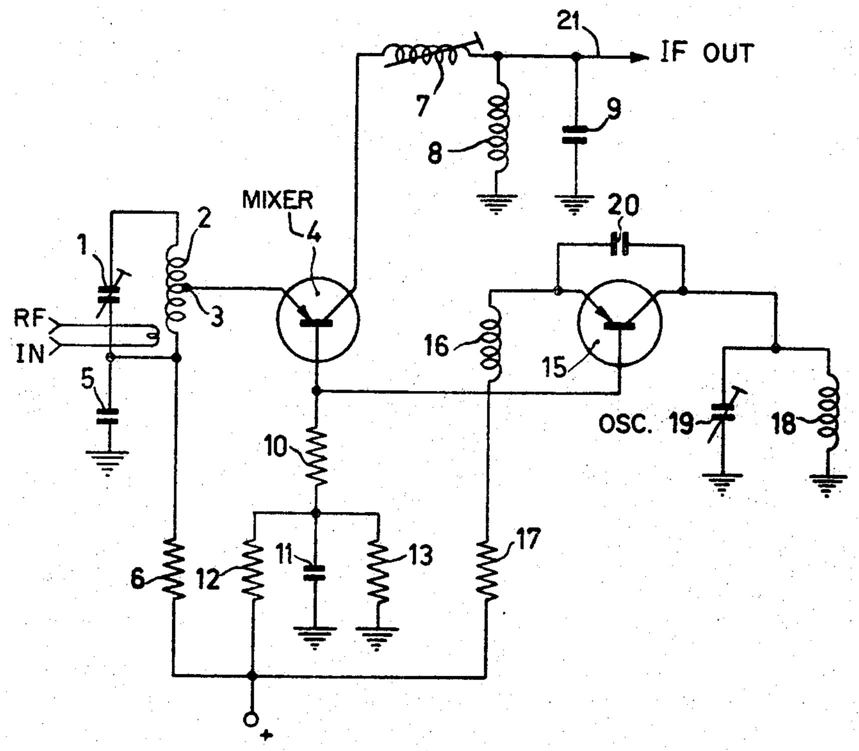
INVENTOR.
KARL HEINZ KUPFER
BY
Frank R. Trifari
AGENT United States Patent Office 3,493,870
Patented Feb. 3, 1970

3,493,870
MIXING CIRCUIT ARRANGEMENT

Karl Heinz Kupfer, Huls, Germany, assignor, by mesne assignments, to U.S. Philips Corporation, New York, N.Y., a corporation of Delaware Filed May 17, 1966, Ser. No. 550,735
Claims priority, application Germany, May 28, 1965, P 36,909
Int. Cl. H04b *1/28*
U.S. Cl. 325—451 5 Claims

ABSTRACT OF THE DISCLOSURE

A transistorized oscillator-mixer circuit in which the transistor base electrodes are directly connected together with a resistor going to AC ground and DC bias. An L–C resonant circuit is coupled to the collector of the oscillator transistor. The impedance of the L–C circuit is high at resonance compared to the resistor value thereby minimizing pulling of the oscillator. A typical application would be a UHF TV tuner.

The invention relates to a mixing circuit arrangement for signals, for example, television signals lying in a wide frequency range, more particularly in the ultrahigh-frequency range and, if desired, in the very high-frequency range, said mixing circuit arrangement including a transistor oscillator and a transistor mixer stage, input signals being fed to the emitter circuit of the mixer stage. This emitter circuit includes a resonant circuit tuned to the input signals.

In such circuit arrangements, the problem arises that the mixer stage must be coupled with the oscillator stage in order to cause the oscillation to be operative in the mixer stage, but this coupling readily gives rise to an undesirable coupling between the tuned circuit of the oscillator and the circuit tuned to the input signals in the emitter circuit of the mixer stage. This coupling may result in detuning of the input circuit of the mixer stage or may at least have a disturbing effect on the resonance curve of this circuit; this is especially the case if reactances are introduced into the input circuit by the coupling. Furthermore, there is a risk of the oscillator being pulled into frequency by strong input signals. Consequently, the said phenomena may not only give rise to an undesirable distortion of the transmission curve of the input circuit, but may also prevent the desired frequency transformation from being attained, which results in the prescribed intermediate frequency not being produced.

The object of the invention is to provide a mixing circuit arrangement in which the required coupling between the oscillator and the mixer stage is established so that the resonant circuits cannot exert a disturbing influence on each other.

In a mixing circuit arrangement according to this invention, this end is achieved by including in the base circuits of the two transistors an impedance common to both circuits and of a low real value.

Investigations have proved that the natural capacitances of the oscillator transistor constitute a capacitative impedance between the collector electrode and the base electrode, which impedance forms part of the resonant oscillator circuit. A considerable part of the current in the resonant circuit flows through this impedance and in case of resonance this current is higher than the emitter-collector current applied to the circuit by the transistor. The current in the said capacitative impedance is so high that a low and preferably substantially ohmic impedance in the base circuit is sufficient to produce a voltage of 100 to 200 mv. at the oscillator frequency required for mixing. This voltage can then be supplied to the mixer stage. The low impedance is substantially not coupled with the resonant oscillator circuit and is not coupled either with the input circuit of the mixer stage if the base circuits are connected with each other in accordance with the invention.

The resonant circuit of the oscillator and the input resonant circuit are consequently coupled very loosely.

The invention will now be described more fully with reference to the accompanying drawing.

Input signals are applied to the tuned input circuit composed of a capacitance 1 and an inductance 2. A tapping 3 on the inductance is connected with the emitter of a mixer transistor 4 (for example, of the type AF139). One end of the resonant circuit is connected to earth through a capacitor 5 of high capacitance. In order to permit of adjusting the working-point of the transistor, this end is also connected through a resistor 6 of 1KΩ to the positive terminal of a supply source of, for example, 12 v.

The collector circuit of the mixer transistor 4 includes an adjustable coil 7 which is tuned to the intermediate frequency by means of the input capacitance 9 of a subsequent intermediate-frequency bandfilter and, by means of the collector capacitance of the transistor 4. The intermediate-frequency oscillations are applied to an intermediate-frequency amplifier through a connection 21. A D.C. path to ground for the collector direct current exists through a coil 8 of high impedance. The base of transistor 4 is connected to earth for alternating current through a small resistor 10 of, for example, 15Ω in series with a capacitor 11 of, for example, 1000 pf. and is further connected through the resistor 10 to a voltage divider 12, 13. The resistors 12 and 13 which are connected to the positive terminal and to the earthed negative terminal, respectively, of the supply source, have a value of 2.2 and 5.6KΩ, respectively.

The base of transistor 4 is directly connected to the base of the oscillator transistor 15 (for example of the type AF139). The emitter of transistor 15 is connected through a coil 16 and an ohmic resistor 17 of 1KΩ to the positive terminal of the supply source. A coil 18 and a preferably adjustable capacitor 19 are connected between the collector of transistor 15 and earth. Furthermore, a feedback capacitor 20 of, for example, 2 pf. is connected between the collector and the emitter of transistor 15.

The resonant circuits 1, 2 and 18, 19 may be tuned in known manner by varying the capacitance or the inductance within a wide range of high frequencies, for example, in the ultrahigh-frequency television band of approximately 400 mc./s. to 900 mc./s. The tuning range may also include the very high-frequency bands of 50 mc./s. and 200 mc./s. so that the whole tuning range extends from approximately 50 mc./s. to 900 mc./s. It is not necessary to vary the coupling between transistors 4 and 15 because of the low impedance 10 in the tuning range.

If the resonant circuit of the oscillator has a high circuit quality of, for example, $Q=100$, the current flowing through the circuit is considerably higher than the current of approximately 1 to 2 ma. applied by the transistor 15 to the circuit. Part of the current flows through the natural capacitance of the transistor 15 to its base electrode and hence also through the common resistor 10. For the oscillations produced across the circuit, these natural capacitances together with the other capacitances included in the circuit arrangement, for example, with the capacitance of the feedback capacitor 20, constitute a capacitative impedance through which an alternating current flows to earth via the resistor included in the base circuit of transistor 15. This alternating current is considerably, for example ten times, higher than the emitter-collector current of transistor 15 which produces oscillations in the circuit 18, 19 with the associated said capacitive impedance and resistor 10. The major part of the resonant circuit current generally flows through the capacitance 19; nevertheless the current flowing through the natural capacitances of the transistor 15 and hence also through the resistor 10 is comparatively high and may be, for example, 10 to 30 ma. Thus, a voltage of 100 to 200 mv. may be produced across the low-value resistor 10, which voltage is sufficient to excite the mixer transistor 4.

It is recommendable that the tuning capacitance 19 of the resonant circuit 18, 19 should be proportioned so that a current which is at least 5 times and preferably 10 to 30 times higher than the collector-emitter current flows through the natural capacitances of the transistor 15 and the common impedance 10.

In order to decouple to the greatest possible extent the elements of the mixer stage and of the oscillator stage between which a coupling is undesirable, more particularly the resonant circuits 1, 2 and 18, 19, the common impedance 10 must be low with respect to the impedance of the oscillator resonant circuit 18, 19. The common impedance 10 is not higher than 2%, or preferably is lower than ½% of the said impedance.

What is claimed is:

1. A mixing circuit arrangement for converting a high frequency signal to an intermediate frequency signal comprising oscillator and mixer transistors each having emitter, base and collector electrodes whereby internal capacitive reactances exist between said electrodes of each of said transistors, means for coupling said high frequency signal to said emitter electrode of said mixer transistor, a resonant circuit coupled between said oscillator collector and ground and having a resonant frequency impedance, means for directly connecting said base electrodes together, a common impedance coupled between said base electrodes and ground whereby the oscillation current of said oscillation transistor flows through the collector-base electrode capacitance of said oscillation transistor and thereafter through said common impedance to ground.

2. A converter as defined in claim 1 wherein the impedance of the resonant circuit at the resonant frequency is large with respect to the common impedance, whereby said oscillator-mixer coupling is low.

3. A converter as defined in claim 2 wherein said common impedance is not more than two percent of the resonant frequency impedance.

4. A converter as defined in claim 1 wherein said resonant circuit comprises an inductance-capacitance circuit wherein the current flowing through the internal collector base electrode capacitance of said oscillator transistor is at least five times that of the current flowing through the collector-emitter of said oscillator transistor.

5. A converter as defined in claim 1 further comprising means for biasing said emitters and means for biasing said base electrodes.

References Cited

UNITED STATES PATENTS 2,994,767 8/1961 Rhodes ------------ 325—319

KATHLEEN H. CLAFFY, Primary Examiner

C. W. JIRAUCH, Assistant Examiner

U.S. Cl. X.R.

325—439